United States Patent
Chiou et al.

(10) Patent No.: US 6,309,912 B1
(45) Date of Patent: Oct. 30, 2001

(54) METHOD OF INTERCONNECTING AN EMBEDDED INTEGRATED CIRCUIT

(75) Inventors: Wayne Wen-Haw Chiou; Douglas H. Weisman, both of Sunrise; Kenneth D. Cornett, Coral Springs, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/597,215

(22) Filed: Jun. 20, 2000

(51) Int. Cl.[7] ................................................. H01L 21/44
(52) U.S. Cl. ........................... 438/118; 438/107; 438/126
(58) Field of Search .................................... 438/106, 107, 438/118, 119, 125, 126, 127, 597, 598, 599, 618; 361/728, 729, 730, 736, 752, 760, 761, 764, 820

(56) References Cited

U.S. PATENT DOCUMENTS 4,835,847 * 6/1989 Kamperman .
5,032,896 * 7/1991 Little et al. .
5,990,553 * 11/1999 Morita et al. .

* cited by examiner

Primary Examiner—Charles Bowers
Assistant Examiner—Evan Pert
(74) Attorney, Agent, or Firm—Frank M. Scutch, III

(57) ABSTRACT

A method of interconnecting electrical terminations (12) of an integrated circuit die (30) to corresponding circuit traces (22) of a circuit carrying substrate (20). The die is placed in a cavity (24) in the substrate such that the electrical terminations on the die are aligned with corresponding circuit traces on the substrate, and so that the surfaces of the die and substrate are coplanar. A film (40) is vacuum laminated over the substrate and the die with heat and pressure. The film is then heated so that it flows to fill the spaces (34) between the die and sidewalls of the cavity, and is then cured. Excess film is then removed everywhere except that which is in the space between the die and the cavity walls. Electrical interconnections (100) are then plated up between the terminations and the circuit traces to bridge the distance between the terminations and the circuit traces. These interconnections are plated directly on the surface of those portions of the laminated film that lie between the sides of the die and of the cavity.

14 Claims, 4 Drawing Sheets

METHOD OF INTERCONNECTING AN EMBEDDED INTEGRATED CIRCUIT

TECHNICAL FIELD

This invention relates in general to a method of electrically interconnecting integrated circuits, and more specifically, to a method of making connections to integrated circuits embedded in a substrate.

BACKGROUND

The traditional method of electrically interconnecting an integrated circuit (IC) die to a substrate is to: (1) make a package, such as a ball grid array (BGA), (2) mechanically attach the IC to the package, (3) interconnect the IC to the package by ultrasonically welding very thin wires from pads on the die to the package, (4) seal the package to environmentally protect the IC, (5) solder the package to the desired motherboard or substrate, such as a ceramic circuit, multi-chip module, or circuit board. Alternatively, one can attach the IC directly to the substrate by turning it upside down and attaching it directly to the substrate, or to an interposer. This well known method is commonly referred to as 'flip chip'. When using flip chip or ball grid array (BGA) methods, there is no ability to visually inspect the connections, because the connections are underneath the IC. Visual inspection of the interconnections is an important consideration in high density, high reliability manufacturing processes. Additionally, it is difficult to adequately remove the heat generated by the IC in the inverted flip-chip structure. It would be a valuable addition to the art if there were a method to interconnect an IC to a substrate that allowed visual inspection of the connections, provided for adequate thermal management of the IC, and could add the IC without adding any additional size due to a package or interposer.

DETAILED DESCRIPTION OF THE PREFERRED EMBODIMENT

A method of interconnecting electrical terminations of an integrated circuit die to corresponding circuit traces of a circuit carrying substrate. The die is placed in a cavity in the substrate such that the electrical terminations on the die are aligned with corresponding circuit traces on the substrate, and so that the surfaces of the die and substrate are coplanar. A film is vacuum laminated over the substrate and the die with heat and pressure. The film is then heated so that it flows to fill the spaces between the die and sidewalls of the cavity, and is then cured. Excess film is then removed everywhere except that which is in the space between the die and the cavity walls. Electrical interconnections are then plated up between the terminations and the circuit traces to bridge the distance between the terminations and the circuit traces. These interconnections are plated directly on the surface of those portions of the laminated film that lie between the sides of the die and of the cavity. Our new method of die attachment eliminates the conventional wire-bonding and/or packaging of the die. It is a direct chip attach method. This elimination results in cost benefits, height profile reduction, and a decrease in the length of electrical interconnections. When this process is applied to a substrate which is a final subassembly, such as a printed circuit board in a communications device, our method can eliminate solder connections and reduce the device's part count. The reduction of interconnect length improves electrical performance by reducing unwanted inductance, resistance, and parasitic capacitance. Our embedded die process also provides a more direct path to conduct heat from the bottom of the die into the substrate. Safety and environmental concerns have resulted in legislation to regulate the use of toxic metals such as lead. Since our process eliminates the conventional solder connection, a reduction in toxic materials is also realized.

Figure 1:
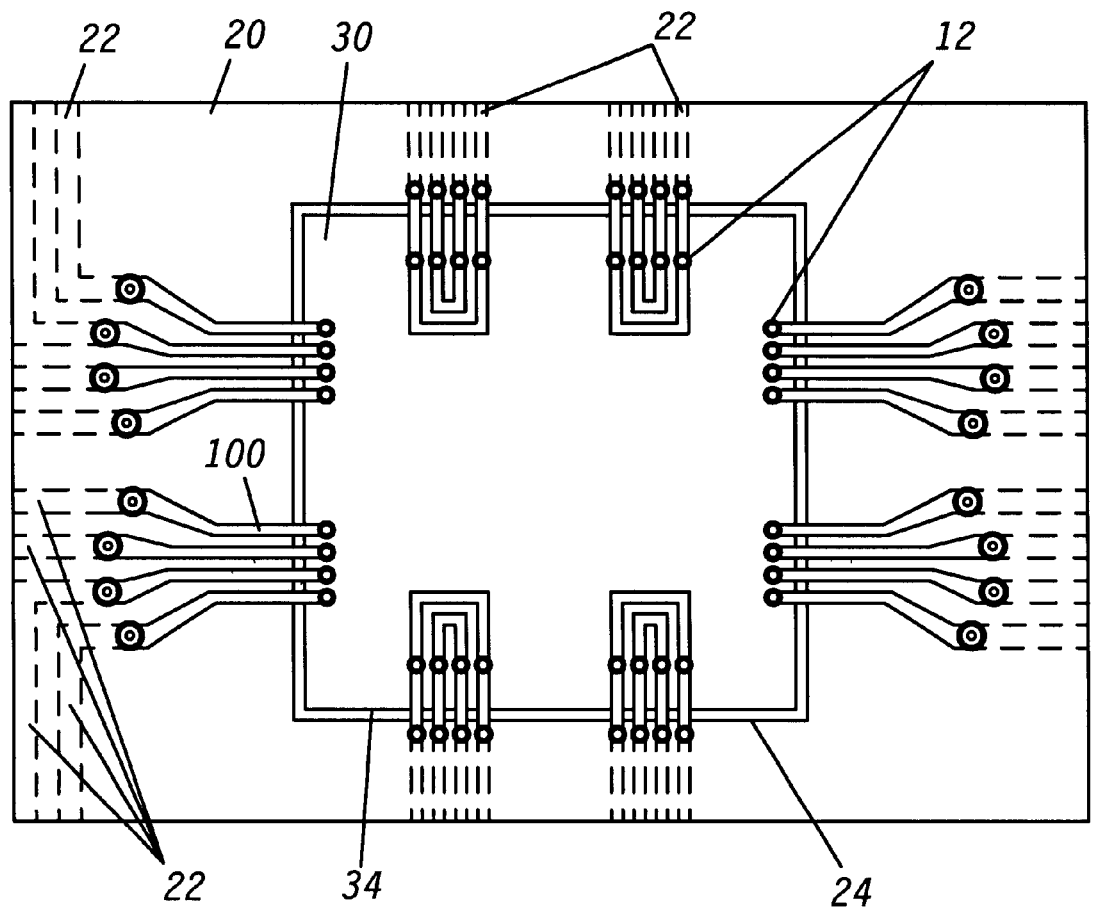
FIG. 1 is a plan view of a die embedded in a substrate and electrically interconnected in accordance with the invention.
Figure 2:
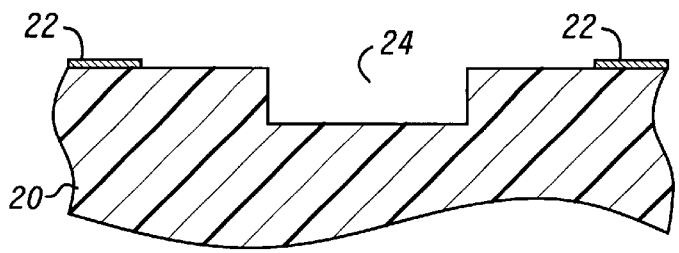
FIGS. 2 through 11 are cross sectional views of a substrate and die in the various steps of embedding and interconnecting the die in the substrate according to various embodiments of our invention.
Figure 3:
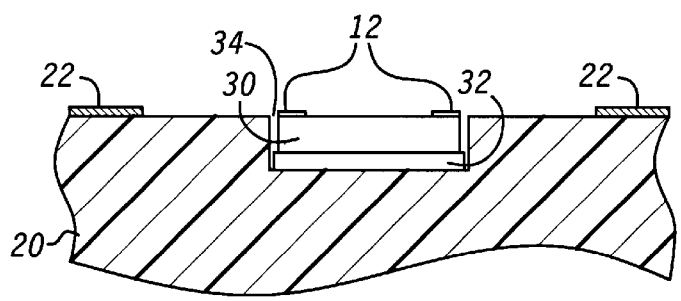

While the specification concludes with claims defining the features of the invention that are regarded as novel, it is believed that the construction, method of operation and advantages of the invention will be better understood from a consideration of the following description of one embodiment of the invention in conjunction with the drawing figures, in which like reference numerals are carried forward. Referring now to FIGS. 1 and 2, a dielectric substrate 20 is used as the base for the construction. The substrate 20 is intended to carry a circuit pattern 22, such as is normally found in electronic devices, and can be, for example, any substrate to which one wishes to interconnect the die, as long as a pocket can be formed. Some substrate examples include ceramics, printed circuit board (PCB) laminates, molded plastics, etc. The circuit traces 22 are formed in any of a number of conventional ways that are well known to those of ordinary skill in the art, and are formed to correspond to the terminations or pads on the perimeter of the IC die. Typically, one circuit trace or runner is provided for each IC die pad, but often times there is not a one-to-one correlation. The circuit carrying substrate 20 is formed with a cavity 24 on one of the major surfaces that is approximately the same depth as the thickness of the IC die that will be used. In order to provide for easy insertion of the IC die into the cavity, the cavity 24 is slightly larger in length and width than the corresponding length and width of the die that will be placed therein, but care should be taken not to make the cavity substantially larger than the die. The use of a cavity to hold the die introduces the problem of planarization of the surface with the high aspect ratio gaps that are formed between the die and the cavity sidewalls, which will be addressed subsequently. As shown in FIG. 3, a die attach adhesive 32 is deposited in the bottom of the cavity, and the die 30 is placed on the adhesive so as to bond it securely to the substrate. We found that an electrically conductive silver-filled epoxy was a particularly good material for this application, specifically a material known as Epotek H31LV from the Epoxy Technology Company. However, other adhesives or methods could be substituted without harming the intent and final result of the invention, depending on the IC die requirements. For example, some die may not require electrical connection to the back side, or one might wish to use a more thermally conductive material to extract heat from the die. Next, the IC die 30 is placed, face up, into the cavity 24 and aligned so that the bond pads 12 on the die are precisely lined up with the corresponding circuit traces 22 on the substrate. The accuracy of die placement is critical. The die is preferably placed with equipment capable of accurately placing the die in X, Y, Z, and theta dimensions. This accuracy is necessary so that a single reticule or mask (artwork) for the interconnect can be used and aligned to the substrate and to multiple die. Although the drawing figures depicting this embodiment show only a single die and a single cavity, it should be clear to the reader that more than one die can be embedded into a substrate. In fact, the use of multiple die on a substrate greatly enhances the utility of our invention, and we believe that it finds productive use this way. Once the die are placed, the adhesive 32 is cured via conventional means (i.e. thermal and/or radiation), thus securing the positions of all the die 30 in the substrate 20.

Figure 4:
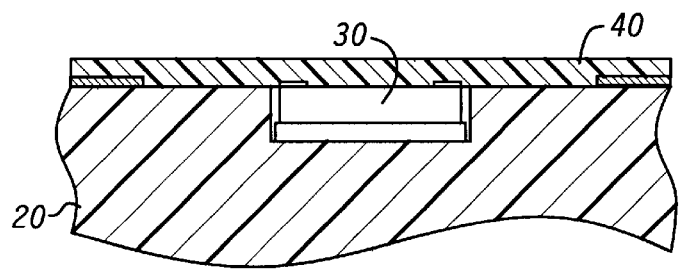

In order to define the runners that will interconnect the die with the substrate, the surface needs to be planarized. The process of planarizing with liquid dielectrics is commonly achieved in the prior art by spin coating, curtain coating, or screen printing. These application processes trap air in the gap 34 between the die and the cavity walls, and the air subsequently expands when the adhesive is thermally cured, creating bubbles and/or voids in and under the planarization material, which is unacceptable. Others have sought to use a dry film dielectric to fill the gap, but in this method, the dry film tends to sag down into the gap 34 during curing, leaving a valley, which is also unacceptable. Our processing method fills the gap 34 sufficiently so as to allow planarization to occur without voids and without sagging. Referring now to FIG. 4, a dry film material 40 is vacuum laminated on the top side of the die 30 and on the top side of the substrate 20. We have found that a material from E. I. DuPont de Nemours Company known as Pyralux® PC1020 works particularly well. Pyralux® PC1020 is a urethane, acrylic, and polyimide blend, and is normally used as a photo definable cover lay material in the manufacture of flexible printed circuits. This film was chosen for its chemical resistant properties (including the ability to withstand copper plating solutions), and the mechanical and thermal properties of the cured film. However, numerous other photo definable films could be substituted, and one of ordinary skill in the art will be cognizant of proper substitutions. The film 40 is placed in contact with the depopulated substrate 20, and the entire assembly is the placed in a vacuum sealable bag (not shown). The bag is then evacuated and sealed, and heated in a chamber, such as an oven, to a temperature that exceeds the softening point of the uncured film 40 in order to bond or laminate the film 40 to the die 30 and substrate 20. In the case of Pyralux® PC1020, that temperature is 70° C., and we held it at temperature for 30 minutes before cooling and cutting the bag open to remove the substrate and die assembly. We found it convenient to use this method for vacuum lamination; however, any comparable commercial vacuum laminating equipment or method could be substituted. The key point here is that a vacuum must be used in the laminating step in order to remove any residual gasses that might be trapped in the space between the die and the cavity sidewalls. By using a vacuum lamination process, we have insured that the problems of bubbles, voids and sags experienced in the prior art are eliminated.

Figure 5:
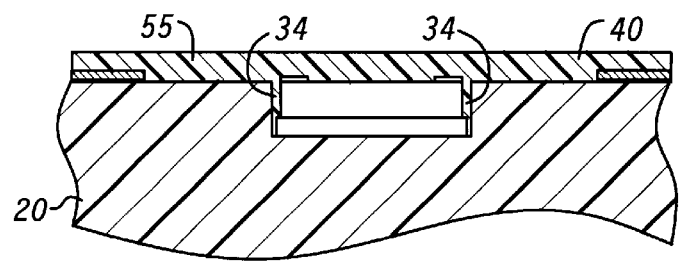

Referring now to FIG. 5, the film 40 is heated at 150° C. for one hour to cure it, then further heated briefly at or slightly above the glass transition temperature of the film. This causes the film 40 to flow into the evacuated gaps 34 below the film. In the case of the Pyralux® PC1020, the further heating was at 215° C. (the glass transition temperature (Tg) of the cured film) for 10 minutes. Filling gaps between the die and the cavity sidewalls planarizes the surface 55, thus allowing interconnect runners formed in subsequent processing to smoothly transition from the substrate surface to the die surface.

Figure 6:
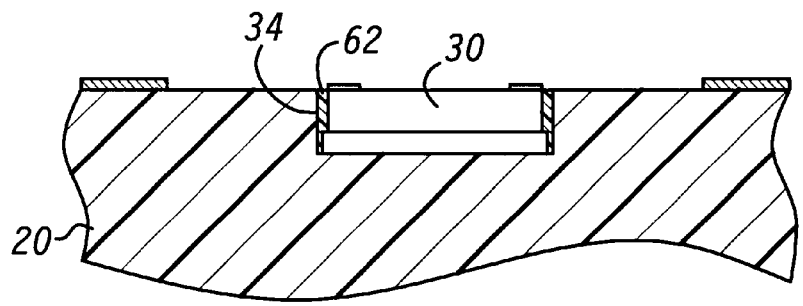

Referring now to FIG. 6, the surface of the planarized film is dry etched until the laminated film is removed from the surfaces of the die 30 and substrate 20, leaving only the film 62 that has sunk into the gaps 34, so as to provide a smooth, discontinuous surface on the die and the substrate. This was performed in a reactive ion etcher (RIE) using an oxygen plasma. Other simpler and less expensive methods may be used to reduce or eliminate the RIE processing. For example, if the die 30 is placed such that the die's upper surface is just slightly below the substrate 20 surface, then the excess polymer film 40 could be mechanically lapped close to the substrate level, and only a small amount of RIE would be needed. This would eliminate most of the time in the RIE.

Figure 7:
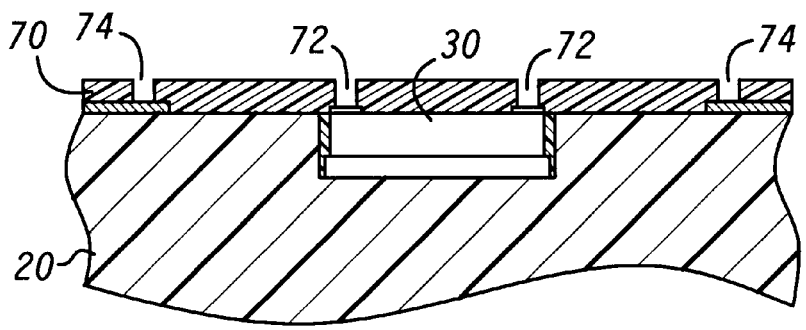

Referring now to FIG. 7, the planarized surface is again vacuum laminated with another layer 70 of a photodefinable material (we again used the Pyralux® PC1020), in a manner similar to that depicted previously in describing FIG. 4. This time, however, the photodefinable properties of the film 70 are used to define interconnect vias 72 to pads 12 on the die 30 and interconnect vias 74 to the circuit traces 22 on the substrate 20. The Pyralux® film is typically exposed to ultraviolet light through a photomask, and developed in a weak sodium carbonate solution. The film is then post-baked at 150° C. for 60 minutes. It may also be possible to use other polymer materials (either dry film or liquid) as a substitute for this material, along with suitable modifications to the processing parameters.

Figure 8:
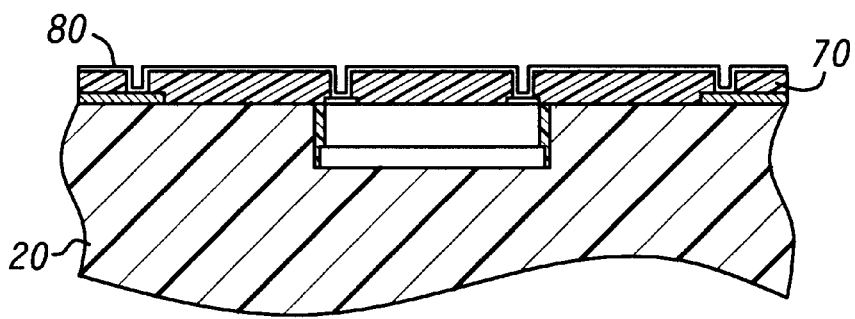

Referring now to FIG. 8, a metal layer 80 is formed on the patterned film material 70. In our embodiment we vacuum deposited two layers of metal, a first layer of titanium followed by a second layer of copper. In our examples, the metal layers were electron-beam evaporated onto the substrates at room temperature under vacuum at $2 \times 10^{-6}$ Torr. Other methods (i.e. sputtering or electroless plating) could also be used. The titanium serves as a 'seed' layer to provide adhesion to the underlying film 70 and was approximately 750 Angstroms thick. Our second layer of copper was approximately 4000 Angstroms thick, and was subsequently used to seed further copper electroplating. This method of vacuum deposition and plating is well known to those skilled in the art of thin film circuitry. The metal layers are deposited not only on the surface of the polymer film 70, but also in the vias 72, 74 so as to provide an electrical interconnect to the underlying circuitry.

Figure 9:
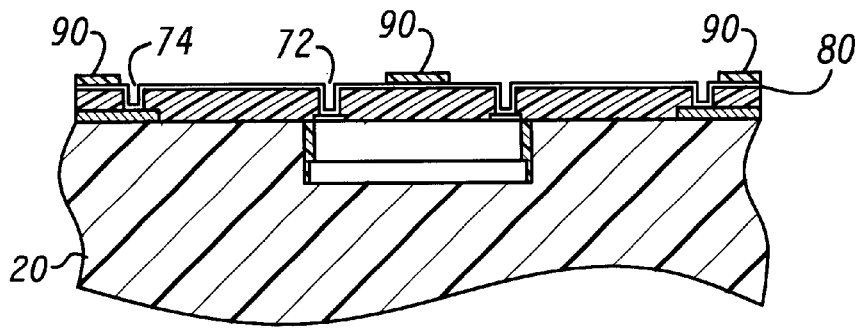

Referring now to FIG. 9, a layer of photoresist 90 is applied and imaged conventionally so as to form appropriate circuit patterns connecting the vias 72 the on the IC 30 to the vias 74 on the substrate 20. In our example we used a liquid photoresist that was spun on at 1000 revolutions per minute for 60 seconds to create a photoimageable film having a thickness of 12 microns, then cured at 110° C. for 3 minutes, exposed for 37 seconds at 15 mJ/cm$^2$ (365 nm wavelength), and then developed in a liquid developing solution. Other types of photoresist and processing schemes could, of course, be substituted. Note in FIG. 9 that portions of the underlying metal layer 80 are now uncovered in selected areas to form a partial circuit pattern.

Figure 10:
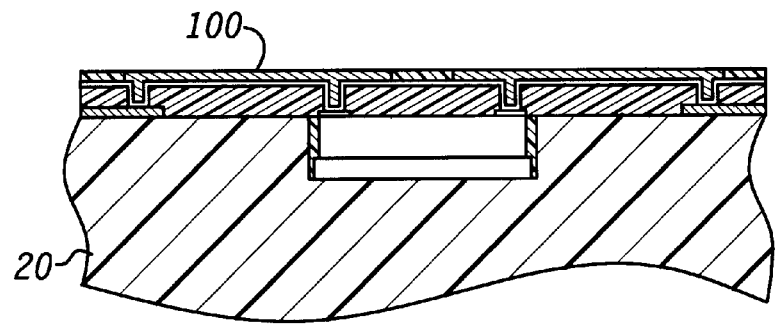
Figure 11:
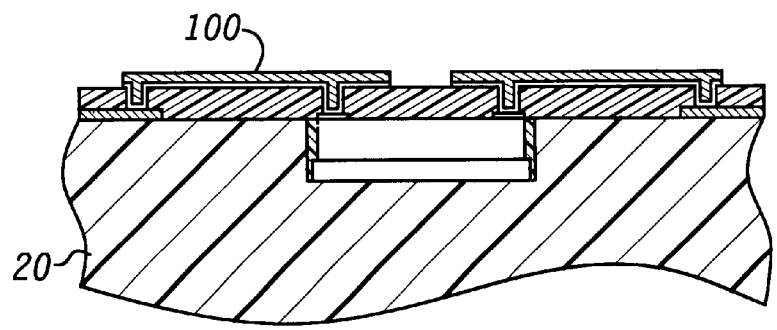

Referring now to FIG. 10, a layer of metal 100 is now electroplated onto the pattern previously developed in the photoresist layer 90, using conventional plating means. Typically, one plates up a reasonable thickness of copper, followed by a thin layer of nickel and a final protective layer of gold, however, other systems could be substituted. All remnants of the photoresist layer 90 are then stripped in an appropriate manner (liquid solutions or dry etching) so as to uncover the unplated portions of the underlying metal layer 80. These unplated, revealed portions are then removed by, for example, acid etching in a bath that removes the thin copper and titanium layers without attacking the gold, so as to produce the structure shown in FIGS. 11 and 1.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of interconnecting electrical terminations of an integrated circuit die to corresponding circuit traces of a circuit carrying substrate, comprising the steps of:

forming a cavity in the circuit carrying substrate, said cavity having a depth approximately equivalent to the thickness of the integrated circuit die and a length and width approximately equivalent to the length and width of the integrated circuit die;

placing the integrated circuit die in the cavity such that the electrical terminations are aligned with the corresponding circuit traces, and such that an upper surface of the die is substantially coplanar with an upper surface of the substrate;

laminating a film to the upper surfaces of the substrate and the die with heat and pressure while maintaining a vacuum on the workpieces;

heating the laminated film at a temperature sufficient to cause it to at least partially flow into any apertures between sides of the die and sidewalls of the cavity, and further heating at a temperature above the glass transition temperature of the film, sufficient to cure the film;

removing the film from the upper surfaces of the die and the substrate so as to expose the terminations and the circuit traces; and forming electrical interconnections between the terminations and the circuit traces, said electrical interconnections bridging the distance between the terminations and the circuit traces by being situated directly on the surface of those portions of the laminated film that lie between the sides of the die and sidewalls of the cavity.

2. The method as described in claim 1, wherein the step of placing further comprises applying a die attachment adhesive in the cavity prior to placing the die in the cavity.

3. The method as described in claim 2, wherein the die attachment adhesive is conductive silver epoxy.

4. The method as described in claim 2, wherein the step of placing further comprises curing the die attachment adhesive to bond the die to the substrate.

5. The method as described in claim 1, wherein the step of laminating further comprises laminating in a vacuum sealable bag.

6. The method as described in claim 1, wherein the laminated film comprises a urethane, acrylic, and polyimide admixture.

7. The method as described in claim 1, wherein the step of laminating further comprises heating past the uncured softening point of the film.

8. The method as described in claim 1, wherein the step of laminating further comprises heating at 70° C.

9. The method as described in claim 1, wherein the step of heating the laminated film at a temperature sufficient to cause it to at least partially flow further comprises heating at 150° C. for one hour.

10. The method as described in claim 1, wherein the step of further heating at a temperature above the glass transition temperature of the film comprises heating at 215° C.

11. The method as described in claim 1, wherein the step of removing further comprises dry etching the film.

12. The method as described in claim 11, wherein the step of dry etching further comprises reactive ion etching with an oxygen plasma.

13. The method as described in claim 1, wherein the step of removing comprises the steps of:

laminating a second film to the upper surfaces of the substrate and the die with heat and pressure while maintaining a vacuum on the workpieces;

photodefining vias in the second laminated film;

vacuum depositing metal over the second film and in the photodefined interconnection paths;

applying a layer of photoresist over the vacuum deposited metal;

photodefining interconnection paths between the terminations and the circuit traces in the layer of photoresist so as to reveal portions of the vacuum deposited metal;

electroplating copper onto the revealed portions of the vacuum deposited metal;

removing the layer of photoresist so as to reveal unplated portions of the vacuum deposited metal; and removing the revealed unplated portions of the vacuum deposited metal.

14. A method of interconnecting electrical terminations of an integrated circuit die to corresponding circuit traces of a circuit carrying substrate, comprising the steps of:

forming a cavity in the circuit carrying substrate, said cavity having a depth approximately equivalent to the thickness of the integrated circuit die and a length and width approximately equivalent to the length and width of the integrated circuit die;

placing the integrated circuit die in the cavity such that the electrical terminations are aligned with the corresponding circuit traces, and such that an upper surface of the die is substantially coplanar with an upper surface of the substrate;

laminating a film to the upper surfaces of the substrate and the die with heat and pressure while maintaining a vacuum on the workpieces;

heating the laminated film at a temperature sufficient to planarize the film and cause it to at least partially flow into any apertures between sides of the die and sidewalls of the cavity, and further heating at a temperature above the glass transition temperature of the film, sufficient to cure the film;

removing the laminated film from the upper surfaces of the die and the substrate;

laminating a second film to the upper surfaces of the substrate and the die with heat and pressure while maintaining a vacuum on the workpieces;

photodefining vias in the second laminated film;

vacuum depositing a layer of titanium and a layer of copper over the second film and in the photodefined interconnection paths;

applying a layer of photoresist over the vacuum deposited metal;

photodefining interconnection paths between the terminations and the circuit traces in the layer of photoresist so as to reveal portions of the vacuum deposited metal;

electroplating copper onto the revealed portions of the vacuum deposited metal;

removing the layer of photoresist so as to reveal unplated portions of the vacuum deposited metal; and removing the revealed unplated portions of the vacuum deposited metal.

* * * * *